(12) United States Patent
Pudas et al.

(10) Patent No.: US 11,447,867 B2
(45) Date of Patent: Sep. 20, 2022

(54) COATING OF 3-DIMENSIONAL SUBSTRATES

(71) Applicant: Picosun Oy, Espoo (FI)

(72) Inventors: Marko Pudas, Masala (FI); Riina Ritasalo, Masala (FI)

(73) Assignee: Picosun Oy, Espoo (FI)

( * ) Notice: Subject to any disclaimer, the term of this patent is extended or adjusted under 35 U.S.C. 154(b) by 362 days.

(21) Appl. No.: 16/832,140

(22) Filed: Mar. 27, 2020

(65) Prior Publication Data

US 2020/0308697 A1     Oct. 1, 2020

Related U.S. Application Data

(60) Provisional application No. 62/826,015, filed on Mar. 29, 2019.

(51) Int. Cl.
*C23C 16/458*     (2006.01)
*C23C 16/455*     (2006.01)

(52) U.S. Cl.
CPC ...... *C23C 16/458* (2013.01); *C23C 16/45544* (2013.01)

(58) Field of Classification Search
CPC .. C23C 16/458; C23C 16/15544; H01L 24/73
See application file for complete search history.

(56) References Cited

U.S. PATENT DOCUMENTS

| 3,713,874 | A  | 1/1973  | Wright et al. |
| 6,423,411 | B2 | 7/2002  | Balkus, Jr. et al. |
| 6,777,085 | B1 | 8/2004  | Argoitia et al. |
| 7,270,715 | B2 | 9/2007  | Dando et al. |
| 8,778,083 | B2 | 7/2014  | Kim et al. |
| 9,248,472 | B2 | 2/2016  | Viasnoff |
| 10,858,253 | B2 * | 12/2020 | Snure ............... H01L 21/02631 |
| 11,270,871 | B2 * | 3/2022  | Zong ..................... C23C 16/515 |
| 2015/0361552 | A1 | 12/2015 | Kostamo |
| 2017/0327948 | A1 | 11/2017 | Dadheech et al. |
| 2018/0247875 | A1 | 8/2018  | Kang et al. |
| 2018/0363136 | A1 | 12/2018 | Mien et al. |
| 2018/0374686 | A1 | 12/2018 | Collins et al. |

OTHER PUBLICATIONS

European Patent Office, Extended European Search Report, Application No. 20165500.8-1103, dated Aug. 7, 2020, 8 Pages.

\* cited by examiner

*Primary Examiner* — Luan C Thai

(74) *Attorney, Agent, or Firm* — Ziegler IP Law Group, LLC

(57) ABSTRACT

A substrate processing apparatus, including a reaction chamber, at least one coating material inlet to the reaction chamber, a movable substrate support to support 3D substrates to be coated, and an actuator configured to move the substrate support to change the orientation of said 3D substrates during substrate processing. A method for coating 3D substrates, the method including providing 3D substrates within a reaction chamber on a substrate support, feeding at least one coating material into the reaction chamber, and changing the orientation of said 3D substrates during substrate processing by actuating a movement of the substrate support.

13 Claims, 2 Drawing Sheets

COATING OF 3-DIMENSIONAL SUBSTRATES

FIELD

The disclosed embodiments generally relate to coatings and their manufacturing methods.

BACKGROUND

This section illustrates useful background information without admission of any technique described herein representative of the state of the art.

Coating three-dimensional (3D) parts, such as medical implants may have coating conformality issues. In general, ALD is able to produce conformal coatings with aspect ratios up to 3000:1, but this is in ideal cases with a suitable flow of process chemicals. There are some precursors and process conditions (such as low required temperature) where the growth behavior is more of the chemical vapor deposition (CVD) type of deposition instead of pure ALD. Yet further, plasma-enhanced ALD (PEALD) and photo-ALD are generally known to deposit only on surfaces pointing towards plasma or photon sources. Also in some cases, the substrate and the substrate holder may have the facing surfaces so smooth that reactive chemicals cannot penetrate to cover all the faces desired to be coated.

SUMMARY

It is an object of certain embodiments of the disclosed embodiments to improve coating conformality when coating 3D substrates.

According to a first example aspect of the disclosed embodiments there is provided a substrate processing apparatus, comprising:

a reaction chamber;

at least one coating material inlet to the reaction chamber;

a movable substrate support to support a 3D substrate or a plurality of 3D substrates to be coated; and an actuator configured to move the substrate support to change the orientation of said 3D substrate or said plurality of 3D substrates during substrate processing.

Accordingly, the apparatus processes at least one 3D substrate. In certain embodiments, the movement comprises a swinging movement. In certain embodiments, the substrate support is a fibrous web. In certain embodiments, the substrate support comprises fibrous material. In certain embodiments, the substrate support is a fabric or comprises a fabric. In certain embodiments, the substrate support is of polymer or comprises polymer. In certain embodiments, the substrate support is of metal or comprises metal. In certain embodiments, the substrate support is of ceramics or comprises ceramics.

The movement of the substrate support does not have to be continuous. In certain embodiments, the substrate support is moved at least sometimes to change the orientation of the at least one 3D substrate. In certain embodiments, the movement of the substrate support is effected by at least one moving part or specifically in some cases a rotating part, such as a roll. In certain embodiments, the substrate support is a never ending belt. In certain embodiments, the substrate support is a mesh of straight wires or of looped rings (as in chain mail).

In certain embodiments, the apparatus is configured to move the at least one substrate by a basic movement and in certain embodiments also by an additional movement. In certain embodiments, the basic movement is a translational, rotating, or swinging movement, and the additional movement is e.g. vibration, shaking, or lifting.

In certain embodiments, the actuator is configured to move the substrate support to change the orientation of said at least one 3D substrate on said substrate support during substrate processing.

In certain embodiments, the apparatus comprises a sensitive mode to prevent damaging of sensitive substrates. In certain embodiments, the sensitive mode is implemented by soft movements of the substrate support. The definition of softness of the movements depends on the properties of the substrate(s) to be coated.

In certain embodiments, the substrate support is provided with a substrate non-damaging property. The damaging herein may refer to mechanical damages, for example, crushing of substrate edges.

In certain embodiments, the substrate non-damaging property is provided by the substrate support having a non-hard surface (i.e., soft surface) that contacts the 3D substrate(s). In certain embodiments, the said non-damaging property is realized with at least partly separated or at least partly enclosed pockets. In certain embodiments, the substrate support is flexible. In certain embodiments, the substrate support is a web.

In certain embodiments, the substrate support is a suspended structure, such as a suspended swing. In certain embodiments, the suspended structure comprises fabric.

In certain embodiments, the substrate processing apparatus is configured to deposit material on the substrate surfaces by self-saturating surface reactions. In certain embodiments, the apparatus is an ALD (atomic layer deposition) reactor.

According to a second example aspect of the disclosed embodiments there is provided a method for coating one or more 3D substrates, the method comprising:

providing at least one 3D substrate within a reaction chamber on a substrate support;

feeding at least one coating material into the reaction chamber; and changing the orientation of said at least one 3D substrate during substrate processing by actuating a movement of the substrate support.

In certain embodiments, the method comprises providing a sensitive mode to prevent damaging of sensitive substrates. In certain embodiments, the sensitive mode implements soft movements of the substrate support (i.e., movements that do not break the substrate(s) but are enough to change the orientation).

In certain embodiments, the substrate support is provided with a substrate non-damaging property.

In certain embodiments, the method comprises actuating the movement of the substrate support by a structure comprised by the substrate support itself.

In certain embodiments, the substrate support has enclosures, for a limited number of substrates to prevent them from contacting each other. In certain embodiments, the substrate support has one or more enclosures for one substrate.

In certain embodiments, the substrate support is a web, rotated around at least one rotation point so that the substrate is (substrates are) forced to change its (their) orientation.

Different non-binding example aspects and embodiments have been presented in the foregoing. The above embodiments and embodiments described later in this description are used to explain selected aspects or steps that may be utilized in implementations of the disclosed embodiments. It should be appreciated that corresponding embodiments apply to other example aspects as well. Any appropriate combinations of the embodiments can be formed.

BRIEF DESCRIPTION OF THE DRAWINGS

The disclosed embodiments will now be described, by way of example only, with reference to the accompanying drawings, in which.

DETAILED DESCRIPTION

In the following description, Atomic Layer Deposition (ALD) technology is used as an example. However, the disclosed embodiments are not limited to ALD technology, but it can be exploited in a wide variety of substrate processing apparatuses, for example, in Chemical Vapor Deposition (CVD) reactors, and in etching reactors, such as, Atomic Layer Etching (ALE) reactors.

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

The at least one substrate is typically exposed to temporally separated precursor pulses in a reaction vessel to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-enhanced Atomic Layer Deposition (known also as photo-ALD or flash enhanced ALD). The process can also be an etching process, one example of which being an ALE process.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. On the other hand, photo-enhanced ALD has a variety of options, such as only one active precursor, with various options for purging. All these deposition cycles form a timed deposition sequence that is controlled by a logic unit or a microprocessor.

Figure 1:
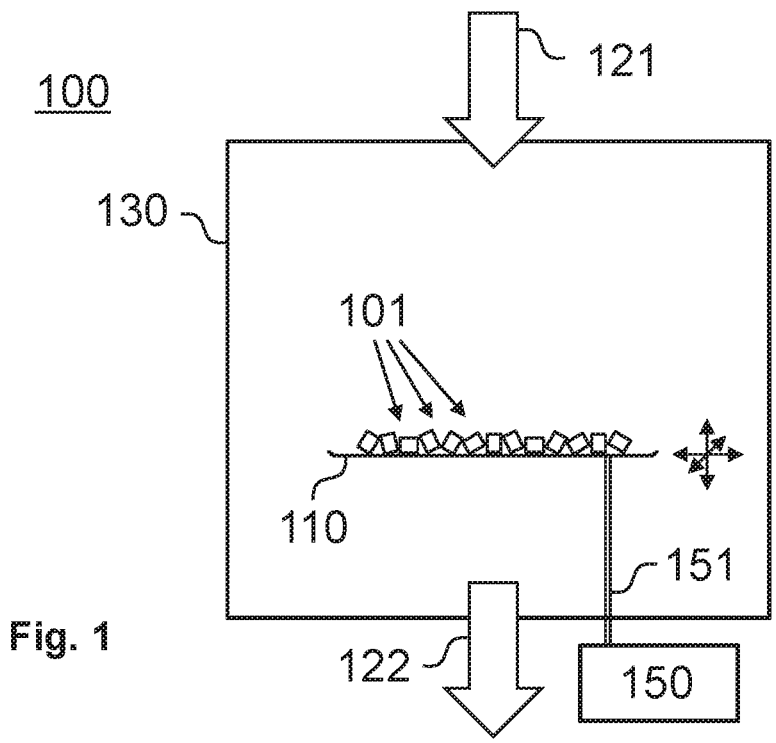
FIG. 1 shows a substrate processing apparatus in accordance with certain embodiments.

FIG. 1 shows a substrate processing apparatus 100 in accordance with certain embodiments. The apparatus 100 comprises a reaction chamber 130, and at least one coating material inlet 121 to the reaction chamber 130. The apparatus 100 further comprises a fore-line 122 to a pump (for exhaust of gases). In the embodiment shown in FIG. 1, the inlet 121 for the coating material (or reactive chemical) is positioned in a top section of the reaction chamber 130 and the fore-line 122 in a bottom section, the general flow direction within the reaction chamber 130 thus being vertical (downwards).

A movable substrate support 110, e.g., a tray or a carrier, supporting or carrying a plurality of 3D substrates 101 is loaded into the reaction chamber 130 for example from a side. An actuator 150 is configured to move the substrate support 110 to change the orientation of said 3D substrates 101 during substrate processing, for example ALD deposition. The actuator 150 may mechanically touch the substrate support 110 actuate the movement of the substrate support 110. This may be realized, e.g., via an actuator rod or wave guide 151 extending from the outside of the reaction chamber 130 to the substrate support 110. The movement of the substrate support may occur in any or all of the general x, y and z directions as illustrated by the small arrows in FIG. 1.

Figure 2:
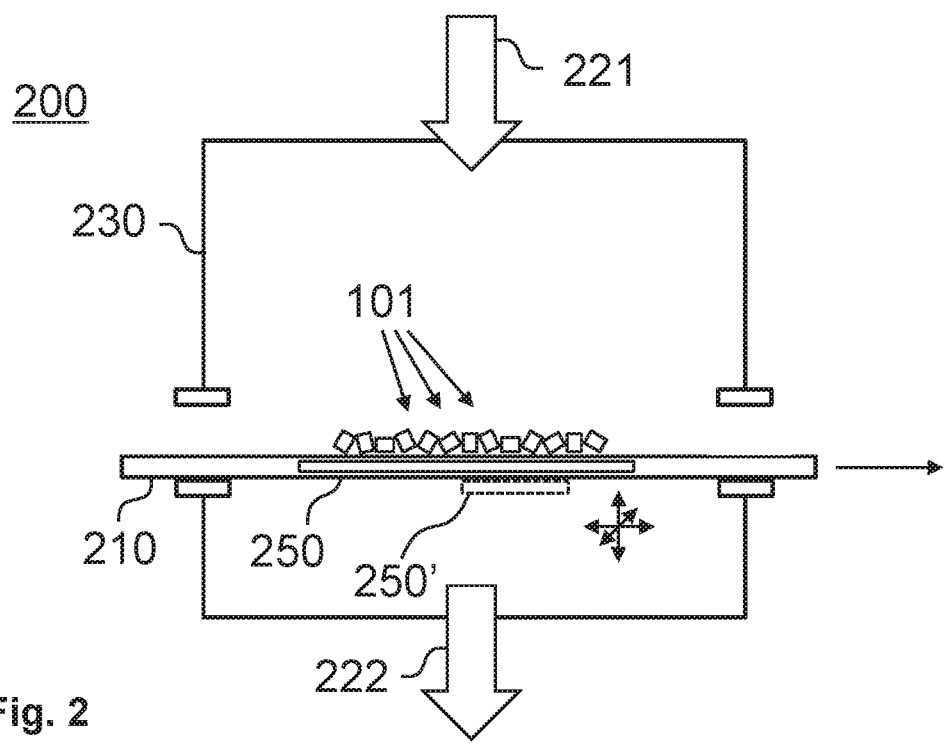
FIG. 2 shows another substrate processing apparatus in accordance with certain embodiments.

FIG. 2 shows another substrate processing apparatus 200 in accordance with certain embodiments. The apparatus 200 comprises a reaction chamber 230, and at least one coating material inlet 221 to the reaction chamber 230. The apparatus 200 further comprises a fore-line 222 to a pump (for exhaust of gases). In the embodiment shown in FIG. 2, the inlet 221 for the coating material (or reactive chemical) is positioned in a top section of the reaction chamber 230 and the fore-line 222 in a bottom section, the general flow direction within the reaction chamber 230 thus being vertical (downwards).

A movable substrate support 210, e.g., a belt or a web, supporting or carrying a plurality of 3D substrates (or just a single 3D substrate) 101 enters the reaction chamber 230 from a first side via an input slit and exits the reaction chamber via an output slit in an opposite side. Accordingly, the movable substrate support 210 undergoes a translational motion.

An actuator 250 which may be integrated in the substrate support 210 actuates additional movement of the substrate support 210. The additional movement may be for example a shaking or vibrating movement of the substrate support 210. The actuator 250 may be integrated into the substrate support 210, or it may be positioned adjacent to the substrate support 210 within the reaction chamber 130 (see actuator 250'), or it may be arranged partly external to the reaction chamber such as the actuator 150 in FIG. 1.

The actuator may mechanically touch the substrate support 210 (as may be with the actuator 250' in FIG. 2) or the actuator may actuate the additional movement from inside of the substrate support 210 (as may be with the actuator 250 in FIG. 2). The (additional) movement of the substrate support may occur in any or all of the general x, y and z directions as illustrated by the small arrows in FIG. 2.

Figure 3:
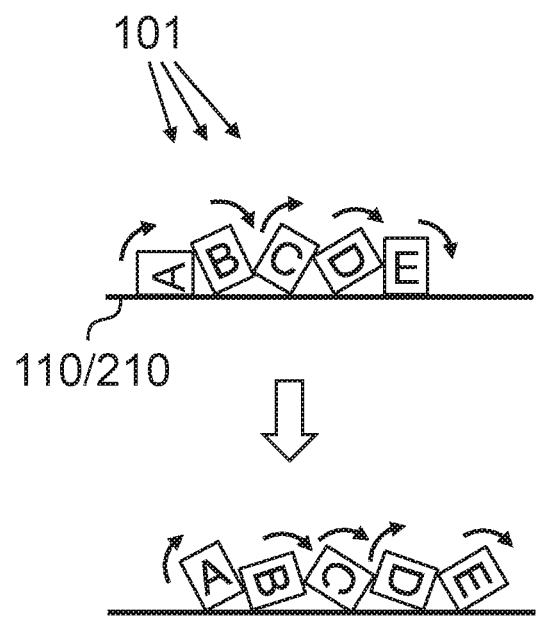
FIG. 3 shows 3D substrates changing orientation in accordance with certain embodiments.

FIG. 3 shows 3D substrates changing orientation in accordance with certain embodiments. As mentioned the substrate support 110/210 is actuated in certain embodiments into a movement (or additional movement depending on the embodiment). The purpose of this movement is to change the orientation of 3D substrates during processing so that performed process steps, such as ALD deposition, can occur on each of the surfaces of the 3D substrates. The substrates surfaces contacting the substrate support 110/210 for example may not be coated as uniformly as other (free) surface areas of the 3D substrates. By changing the orientation (so that it is not always the same spot of the 3D substrate that touches the substrate support) uniformity of deposition can be improved.

In the example illustration of FIG. 3, five 3D substrates A-E change their orientation from an initial stage of the upper drawing to a subsequent stage of the lower drawing due to external movement caused by actuating the support 110/210.

In certain embodiments, the apparatus 100/200 comprises a sensitive mode to prevent damaging of sensitive substrates. In certain embodiments, the sensitive mode is implemented by soft movements of the substrate support 110/210.

In certain embodiments, the substrate support 110/210 is provided with a substrate non-damaging property. The damaging herein may refer to mechanical damages, for example, crushing of substrate edges.

In certain embodiments, the substrate non-damaging property is provided by the substrate support 110/210 having a non-hard surface (i.e., soft surface) that contacts the 3D substrate(s) 101. In certain embodiments, the substrate support 110/210 is flexible. In certain embodiments, the substrate support is a web or belt as mentioned. In certain embodiments, the substrate support is made of fiber type material(s), such as fabric. In certain embodiments, the substrate support is made of polymer such as silicone polymer, having the benefit of not becoming coated by all ALD reactions. In other embodiments, the substrate support may be a carrier or a tray. The substrate support may have rising edges. In certain embodiments, the substrate support is in the form of a mesh. In certain embodiments, the mesh is made of metal (using straight wires). In other embodiments, the mesh is made of metal rings or ceramic rings (as in chain mail, for example).

In certain embodiments, the substrate support has enclosures, for a limited number of substrates to prevent them from contacting each other. In certain embodiments, the substrate support has one or more enclosures for one substrate.

In certain embodiments, the substrate support is a web, rotated around at least one rotation point so that the substrate is (substrates are) forced to change its (their) orientation.

Figure 4:
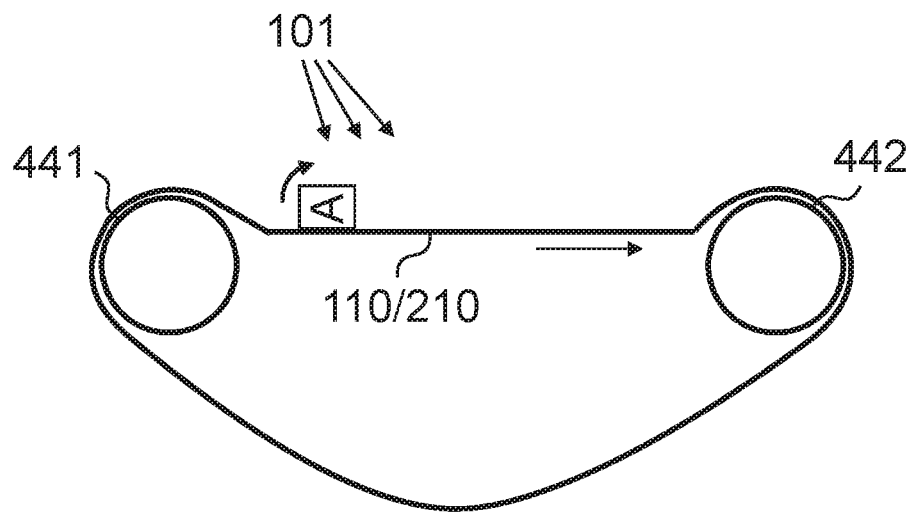
FIG. 4 shows yet another arrangement to support substrate(s) in accordance with certain embodiments.

FIG. 4 shows yet another arrangement to support substrate(s) in accordance with certain embodiments. The substrate support 110/210 is a never ending belt that is moved or circulated by at least one circulation element. In certain embodiments, the substrate support 110/210 is vibrated as desired. An external or integrated actuator may be used. The material and features of the substrate support 110/210 may be similar to those described in the preceding.

In the embodiment shown in FIG. 4, there are provided at least two rotating points 441 and 442 (as circulation elements), of which at least one is rotating or mechanically moving. The rotating points circulate the substrate support 110/210. The arrangement may reside in a reaction chamber (reaction chamber 130, 230, or similar). The movement produced by the arrangement may be a continuous movement where the substrate(s) will rotate, e.g., supported by the substrate support 110/220, downwards from the element 441 or 442. The movement produced by the arrangement may be a back-and-forth movement promoted by the elements 441 and 442. The movement is to change the orientation of a 3D substrate 101 (although only one substrate has been drawn there may be a plurality of 3D substrates instead of a single 3D substrate) residing on the substrate support 110/210. Alternatively, or addition, the arrangement comprises an actuator to produce other or additional movement of the substrate support 110/210. The actuation may be implemented similarly as in other embodiments. Accordingly, an external or integrated actuator may actuate shaking, or vibrating, or lifting movement. This additional or other movement may be short-term non-continuous movement (applies also to other embodiments).

It is observed that, e.g., ALD is conventionally conformal, but this is not always the case with PEALD, UV-ALD (ultra violet ALD, or photo-ALD), and various 'difficult' processes, an example of which may be $HfO_2$, or CVD. Conventionally, 3D coating may require significant overdosing, and some chemicals may even start to grow in a CVD mode (producing lower quality or properties, such as adhesion) on top. In certain embodiments, the substrate holder (or support) is moving the sample to minimize the shadowed or blocked areas due contact to any material it may be in contact with. Significant overdosing is avoided.

The sample holder (substrate support) can be a web which is shaken, vibrated, moved vertically, or rotated as web.

In certain embodiments, motion by mechanical actuation is implemented. This may occur for example through a reaction chamber wall/pump fore-line. In certain embodiments, RF (radio frequency), magnetic actuation, gas flow variation, heat changes (memory shape alloy effect), or actuation generated to the web with e.g. artificial muscle means (e.g., piezo etc. inside elastomer) is implemented. A slow or soft movement of the substrates is sufficient so as to not break sensitive 3D substrate(s).

In certain embodiments, the sample holder (substrate support) is connected to a low frequency or a mechanical vibrator (vibrators producing vibrations from single pulses to ultrasonic vibration may be applied). In certain embodiments, the apparatus includes a POCA (powder coating cartridge, Picosun Oy, Espoo, Finland) assembly and a reaction chamber. In certain embodiments, the substrate support comprises a soft mesh foam, a knitted textile, plastic material, 3D printed profiles or a membrane. In certain embodiments, it may be with a frequent or frequency driven collapse and non-collapse type of substrate with a cap. In certain embodiments, the substrate support is made of material(s) that are less likely to promote ALD growth on it, such as Teflon or silicon polymer. In certain embodiments, the substrate support has its properties modified so that it is so soft that it does not damage the deposited coating (or thin film). In certain embodiments, the substrate support is shaped as a cup to hold in the sample(s) (substrate(s)). In certain embodiments, the substrate support is used in packing/transport, without the need of picking the sample (substrate) with any mechanical tools(s). In certain embodiments, the substrate support is in the form of an open or closed bag. In certain embodiments, the bag forms a closed system (gas-impermeable), with at least one opening for gas inlet and outlet, or two or more openings or holes (inlet(s), outlet). In certain embodiments, the inlet/outlet are adjusted to open only in vacuum conditions (or only depending on prevailing temperature, including shape-memory alloy). Accordingly, ambient air does not reach the substrate (e.g., with closed bellows affect valve etc.).

In certain embodiments, the following method steps: ship in, loading, coating, and ship out are performed without touching the substrate.

In certain embodiments, the handled or processed substrate(s) are medical substrate(s). In certain embodiments, the substrates are medical device(s) or electronical device(s). In certain embodiments, the substrates are implant(s). In certain embodiments, the substrates are substrates other than powder and other than particulate material.

Without limiting the scope and interpretation of the patent claims, certain technical effects of one or more of the example embodiments disclosed herein are listed in the following. A technical effect is enablement of ALD tools for medical applications. Another technical effect is speeding up substrate handling and manufacturing. Another technical effect is increased sterility, and management options. Another technical effect is providing more processing alternatives for processing 3D parts.

The foregoing description has provided by way of non-limiting examples of particular implementations and embodiments, a full and informative description of the best mode presently contemplated by the inventors for carrying out the disclosed embodiments. It is however clear to a person skilled in the art that the disclosed embodiments are not restricted to details of the embodiments presented above, but that it can be implemented in other embodiments using equivalent means without deviating from the characteristics of the disclosed embodiments.

Furthermore, some of the features of the above-disclosed embodiments may be used to advantage without the corresponding use of other features. As such, the foregoing description should be considered as merely illustrative of the principles of the disclosed embodiments, and not in limitation thereof. Hence, the scope of the disclosed embodiments are only restricted by the appended patent claims.

The invention claimed is:

1. A substrate processing apparatus, comprising:
   a reaction chamber;
   at least one coating material inlet to the reaction chamber;
   a movable substrate support to support a 3D substrate or a plurality of 3D substrates to be coated; and
   an actuator configured to move the substrate support to change the orientation of said 3D substrate or a plurality of 3D substrates during substrate processing.

2. The apparatus of claim 1, comprising a sensitive mode to prevent damaging of sensitive substrates.

3. The apparatus of claim 2, wherein the apparatus is configured to implement the sensitive mode by soft movements of the substrate support.

4. The apparatus of claim 1, wherein the substrate support is provided with a substrate non-damaging property.

5. The apparatus of claim 4, wherein the substrate non-damaging property is provided by the substrate support having a non-hard surface that contacts the 3D substrate(s).

6. The apparatus of claim 1, wherein the substrate support is flexible.

7. The apparatus of claim 1, wherein the substrate support is a never ending belt.

8. The apparatus of claim 1, wherein the actuator is configured to move the substrate support around at least one rotation point forcing the substrate or substrates to change orientation.

9. The apparatus of claim 1, wherein the substrate processing apparatus is configured to deposit material on the substrate surfaces by self-saturating surface reactions.

10. A method for coating one or more 3D substrates, the method comprising:
    providing at least one 3D substrate within a reaction chamber on a substrate support;
    feeding at least one coating material into the reaction chamber; and
    changing the orientation of said at least one 3D substrate during substrate processing by actuating a movement of the substrate support.

11. The method of claim 10, wherein the method comprises providing a sensitive mode to prevent damaging of sensitive substrates.

12. The method of claim 10, wherein the substrate support is provided with a substrate non-damaging property.

13. The method of claim 10, comprises:
    actuating the movement of the substrate support by a structure comprised by the substrate support itself.

* * * * *